(12) United States Patent
Mieno et al.

(10) Patent No.: US 8,481,348 B2
(45) Date of Patent: Jul. 9, 2013

(54) PHASE CHANGE MEMORY AND METHOD FOR FABRICATING THE SAME

(75) Inventors: Fumitake Mieno, Shanghai (CN); Youfeng He, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 189 days.

(21) Appl. No.: 13/176,632

(22) Filed: Jul. 5, 2011

(65) Prior Publication Data

US 2012/0161092 A1 Jun. 28, 2012

(30) Foreign Application Priority Data

Dec. 27, 2010 (CN) .......................... 2010 1 0607709

(51) Int. Cl.
*H01L 21/00* (2006.01)
(52) U.S. Cl.
USPC 438/23; 438/517; 257/2; 257/4; 257/E27.004
(58) Field of Classification Search
USPC ................ 438/23, 517; 257/2, 4, 5, E27.004, 257/E27.645
See application file for complete search history.

(56) References Cited

U.S. PATENT DOCUMENTS

| | | | |
|---|---|---|---|
| 7,507,647 B2 * | 3/2009 | Lim .............................. | 438/530 |
| 8,409,883 B2 * | 4/2013 | Mieno et al. .................... | 438/23 |
| 2005/0142740 A1 * | 6/2005 | Fumitake et al. ............. | 438/257 |
| 2011/0305058 A1 * | 12/2011 | Park et al. ....................... | 365/63 |

FOREIGN PATENT DOCUMENTS

CN 101882602 A 11/2010

* cited by examiner

*Primary Examiner* — Cuong Q Nguyen
*Assistant Examiner* — Yosef Gebreyesus
(74) *Attorney, Agent, or Firm* — Anova Law Group, PLLC

(57) ABSTRACT

The invention provides a phase change memory and a method for forming the phase change memory. The phase change memory includes a storage region and a peripheral circuit region. The peripheral circuit region has a peripheral substrate, a plurality of peripheral shallow trench isolation (STI) units in the peripheral substrate, and at least one MOS transistor on the peripheral substrate and between the peripheral STI units. The storage region has a storage substrate, an N-type ion buried layer on the storage substrate, a plurality of vertical LEDs on the N-type ion buried layer, a plurality of storage shallow trench isolation (STI) units between the vertical LEDs, and a plurality of phase change layers on the vertical LED and between the storage STI units. The storage STI units have thickness substantially equal to thickness of the vertical LEDs. The peripheral STI units have thickness substantially equal to thickness of the storage STI units. The N-type conductive region contains SiC. A top of P-type conductive region is flush with a top of the peripheral substrate. The N-type conductive region containing SiC reduces drain current through the vertical LED and raises current efficiency of the vertical LED. The peripheral circuit region can work normally without adverse influence on performance of the phase change memory.

12 Claims, 6 Drawing Sheets

PHASE CHANGE MEMORY AND METHOD FOR FABRICATING THE SAME

CROSS REFERENCE TO RELATED APPLICATIONS

The present application claims the priority of Chinese Patent Application No. 201010607709.X, entitled "PHASE CHANGE MEMORY AND METHOD FOR FABRICATING THE SAME", and filed Dec. 27, 2010, the entire disclosure of which is incorporated herein by reference.

BACKGROUND OF THE INVENTION

1. Field of the Invention

The present invention relates to the field of semiconductor manufacture, and particularly to a phase change memory and a method for fabricating the same.

2. Description of Prior Art

Nowadays, a phase change RAM is put forward as a new nonvolatile memory for new type memory application. As for the phase change memory, a storage unit is formed with phase change material for serving as data storage medium. Heat is supplied for phase change of phase change material. According to the supplied heat, the phase change material has two stable phases, for example non-crystal phase and crystal phase. Typical phase change material comprises Ge—Sb—Te (GST), a composition of Ge, Sb and Te, and the like.

When the phase change material is heated at the proximity of melted temperature for a short time and then is cooled rapidly, it may phase change from crystal phase to non-crystal phase. Reversely, when the phase change material is heated below the melted temperature for a long time and then is cooled slowly, it may phase change from non-crystal phase to crystal phase. The phase change material under the non-crystal phase has higher resistance ratio than under the crystal phase. Thus, it can be determined by current through phase change material, that the data stored in the storage unit of the phase change memory is logic "1" (non-crystal phase and high resistance ratio) or logic "0" (crystal phase and low resistance ratio).

In prior art, the phase change memory is LED drive, in which LED and phase change material are both deposited in a vertical insulated material hole. By the virtue of the robust drive ability of the LED, size of the devices and cross-talk between devices is minimized at most, and stability of the phase change is enhanced.

As shown in FIG. 1, a vertical LED drive phase change memory comprises a storage region 10 and a peripheral circuit region 20.

The storage region 10 comprises a storage substrate 11, an N-type ion buried layer 12 on the storage substrate 11, a storage monocrystalline layer 17 on the N-type ion buried layer 12, storage shallow trench isolation (STI) units 13 in the storage monocrystalline layer 17, vertical LEDs and phase change layers 16 on the vertical LEDs. The storage shallow trench isolation (STI) units 13 have thickness identical to that of the storage monocrystalline layer 17. Each vertical LED comprises an N-type conductive region 14 in the storage monocrystalline layer 17 and between the storage shallow trench isolation (STI) units 13, and a P-type conductive region 15 on the N-type conductive region 14. The vertical LEDs have thickness identical to that of the storage monocrystalline layer 17.

The peripheral circuit region 20 comprises a peripheral substrate 21, a monocrystalline layer 25 on the peripheral substrate 21, peripheral shallow trench isolation (STI) units 23 in the monocrystalline layer 25, MOS transistors 24 in the monocrystalline layer 25 and between the peripheral shallow trench isolation (STI) units 23. Thickness of the peripheral substrate 21 is equal to a sum of that of the N-type ion buried layer 12 and that of the storage substrate 11. The peripheral shallow trench isolation (STI) units 23 have thickness identical to that of the peripheral monocrystalline layer 25.

FIGS. 2-7 are cross-sectional views of intermediate structures of a vertical LED drive phase change memory, illustrating a conventional method for forming the vertical LED drive phase change memory.

Referring to FIG. 2, a substrate is provided, which comprises a storage substrate 11 and a peripheral substrate 21.

Referring to FIG. 3, ions (for example arsenic ions) are implanted into the storage substrate 11 to form an N-type ion buried layer 12.

Referring to FIG. 4, the storage monocrystalline layer 17 grows on the N-type ion buried layer 12 by non-selective extensive process. The peripheral monocrystalline layer 25 grows on the peripheral substrate 21 by non-selective extensive process.

Referring to FIG. 5, the storage STI units 13 are formed in the storage monocrystalline layer 17 in such as way that each storage shallow trench isolation (STI) units 13 have thickness identical to thickness of the storage monocrystalline layer 17. The peripheral STI units 23 are formed in the peripheral monocrystalline layer 25 in such as way that the peripheral shallow trench isolation (STI) units 23 have thickness identical to thickness of the peripheral monocrystalline layer 25.

Referring to FIG. 6, the vertical LEDs are formed in the storage monocrystalline layer 17 and between the storage shallow trench isolation (STI) units 13. Each vertical LED comprises an N-type conductive region 14 and a P-type conductive region 15. During the process of formation, N-type ions are implanted into a lower part of the monocrystalline layer 17 to form the N-type conductive region 14, and P-type ions are implanted into an upper part of the monocrystalline layer 17 to form the P-type conductive region 15 on the N-type conductive region 14. Each vertical LED comprises an N-type conductive region 14 and a P-type conductive region 15. Thickness of the vertical LEDs is identical to that of the storage monocrystalline layer 17.

Referring to FIG. 7, phase change layers 16 are formed on the P-type conductive region 15. The MOS transistors 24 are formed in the peripheral monocrystalline layer 25. Finally, a storage region 10 and a peripheral circuit region 20 are completed.

In practical application, a peripheral circuit region 20 may not work normally. Furthermore, high density and low energy consumption is the tendency of the industry. The prior art vertical LEDs have silicon-based PN junctions, drain current formed by electrical field may occur at the PN junctions. It is desired to reduce drain current of the vertical LEDs and raise the current efficiency of the vertical LEDs.

SUMMARY OF THE INVENTION

A technical problem solved by the invention is to provide a phase change memory which has vertical LEDs with low drain current and high current efficiency, and which has a peripheral circuit region working perfectly without adverse influence on performance of the phase change memory.

Another technical problem solved by the invention is to provide a method for fabricating the phase change memory.

According to one aspect of the invention, a phase change memory comprises a storage region and a peripheral circuit region. peripheral circuit region and a storage region, said peripheral circuit region comprising:
- a peripheral substrate, peripheral shallow trench isolation (STI) units in the peripheral substrate, and
- at least one MOS transistor on the peripheral substrate and between the peripheral STI units; and said storage region including:
- a storage substrate,
- an N-type ion buried layer on the storage substrate,
- a plurality of vertical LEDs on the N-type ion buried layer, each vertical LED comprising an N-type conductive region containing SiC on the N-type ion buried layer, and a P-type conductive region on the N-type conductive region,
- a plurality of storage shallow trench isolation (STI) units between the vertical LEDs, and
- a plurality of phase change layers on the vertical LEDs and between the storage STI units, wherein a top of P-type conductive region is flush with a top of the peripheral substrate, the storage STI units have thickness substantially equal to thickness of the vertical LEDs, and the peripheral STI units have thickness substantially equal to thickness of the storage STI units.

According to another aspect of the invention, a method for fabricating a phase change memory comprises:

providing a substrate including a storage substrate and a peripheral substrate;

forming a sacrificial dielectric layer on the peripheral substrate;

etching the storage substrate and forming an N-type ion buried layer on the storage substrate;

forming a plurality of vertical LEDs on the N-type ion buried layer, each vertical LED comprising an N-type conductive region containing SiC on the N-type ion buried layer, and a P-type conductive region on the N-type conductive region, a top of P-type conductive region being flush with a top of the peripheral substrate;

removing the sacrificial dielectric layer on the peripheral substrate;

forming a plurality of storage STI units between the vertical LEDs, and forming a plurality of peripheral STI units in the peripheral substrate, the storage STI units having thickness substantially equal to thickness of the vertical LEDs, and the peripheral STI units having thickness substantially equal to thickness of the storage STI units; and forming a plurality of phase change layers on the vertical LEDs and between the storage STI units, and forming at least one MOS transistor on the peripheral substrate and between the peripheral STI units.

Optionally, the SiC of the N-type conductive region has carbon concentration with a molar ratio ranging from 1% to 3%.

Optionally, the sacrificial dielectric layer has thickness ranging from 5 nm to 50 nm.

Optionally, the N-type ion buried layer is formed by implanting N-types ions into the storage substrate before etching the storage substrate or after etching the storage substrate.

Optionally, the N-type conductive region is formed on the N-type ion buried layer by selective epitaxial growth, and reaction gases for selective epitaxial growth comprise SiC and N-type ions.

Optionally, a SiC layer is formed on the N-type ion buried layer by selective epitaxial growth, and N-type ions are implanted into the SiC layer for forming the N-type conductive region.

Optionally, the reaction gas SiC has C concentration with a molar ratio ranging from 1% to 3%.

Optionally, the P-type conductive region is formed on the N-type conductive region by selective epitaxial growth, and reaction gases comprise SiGe and P-type ions.

Optionally, oxide or nitride is deposited on the peripheral substrate by low pressure chemical vapor deposition or plasma enhanced chemical vapor deposition for forming the sacrificial dielectric layer.

With the structure of the invention, the phase change memory has high density and low power consumption. In the phase change memory of the invention, the N-type conductive region containing SiC reduces drain current through the vertical LEDs, thereby raising current efficiency of the vertical LEDs. Under forward bias, a barrier of a P—Si and N—SiC hetero junction is alleviated at N—SiC. Transition of electrons from the N—SiC to P—Si is apt to occur. On the contrary, holes in the N—SiC are apt to remain stored instead of transition to P—Si. Current is mainly produced by electrons transition from N-type conductive region to P-type conductive region. Under reverse bias, a barrier of the P-Si and N-SiC hetero junction is elevated at N—SiC. Electrons in the N—SiC are apt to remain stored instead of transition to P—Si. Electrons in the P-type conductive region and holes in the N-type conductive region are comparatively less. In this circumstance, the P—Si and N—SiC hetero junction decreases drain current produced by carriers from the electrical field.

On the other hand, the storage substrate is etched, and height difference is apparently formed between the storage substrate and the peripheral substrate. The sacrificial dielectric layer is formed on the peripheral substrate for forming the N-type ion buried layer and the vertical LEDs on the storage substrate in sequence. A top of the vertical LEDs is flush with a top of the peripheral substrate. Then the sacrificial dielectric layer on the peripheral substrate is removed. In this way, a monocrystalinn layer on the peripheral substrate is not needed. The fabrication cost is reduced correspondingly. The peripheral circuit region can work perfectly without adverse influence on the phase change memory.

BRIEF DESCRIPTION OF THE DRAWINGS

The foregoing and other objects, features and advantages of the invention will be more apparent from the detailed description of the preferred embodiments of the invention as shown in the accompanying drawings, in which identical reference numerals denote the same component. The drawings are not to scale, but focus on the major idea of the invention.

DETAILED DESCRIPTION OF THE EMBODIMENTS

Figure 1:
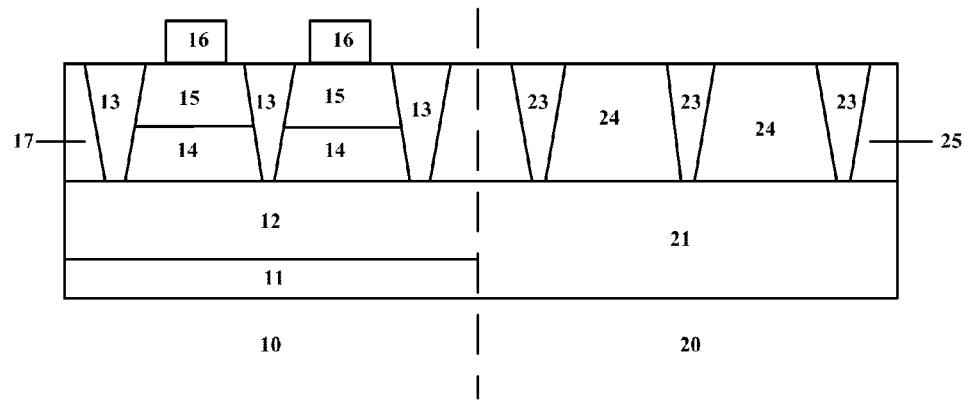
FIG. 1 schematically shows a vertical LED drive phase change memory in prior art.
Figure 2:
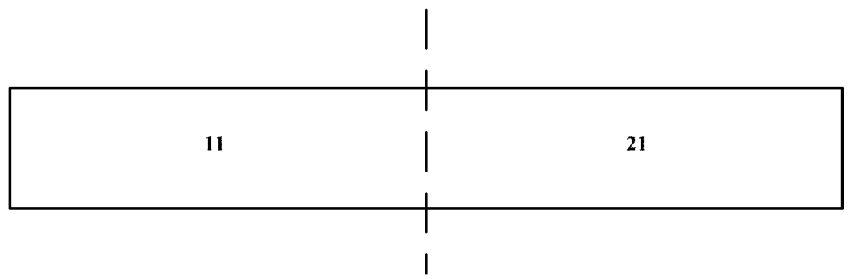
FIGS. 2-7 are cross-sectional views of intermediate structures of a prior art phase change memory, illustrating a conventional method for forming the phase change memory.
Figure 3:
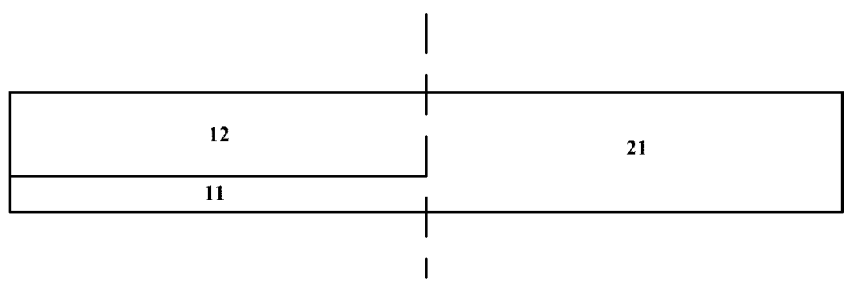
Figure 4:
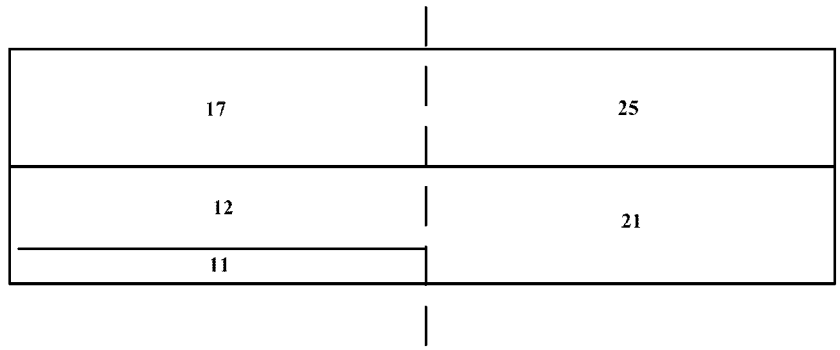
Figure 5:
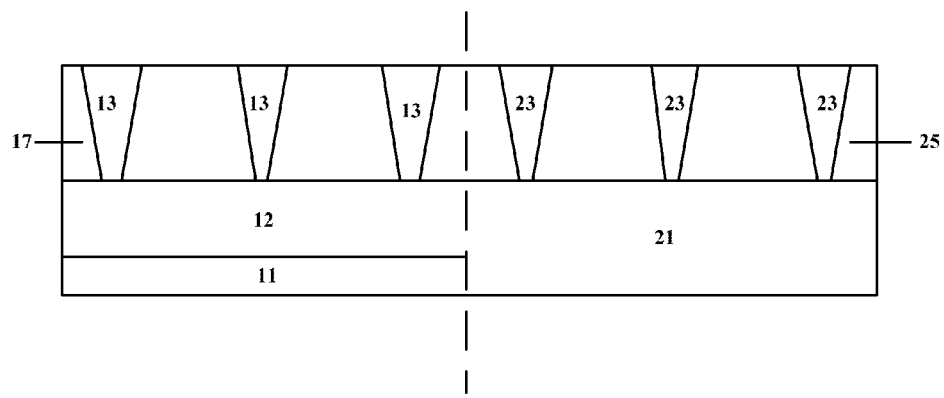
Figure 6:
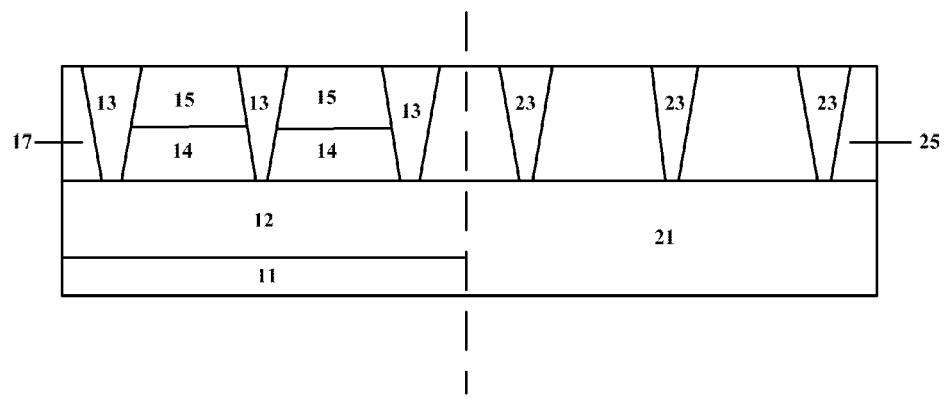
Figure 7:
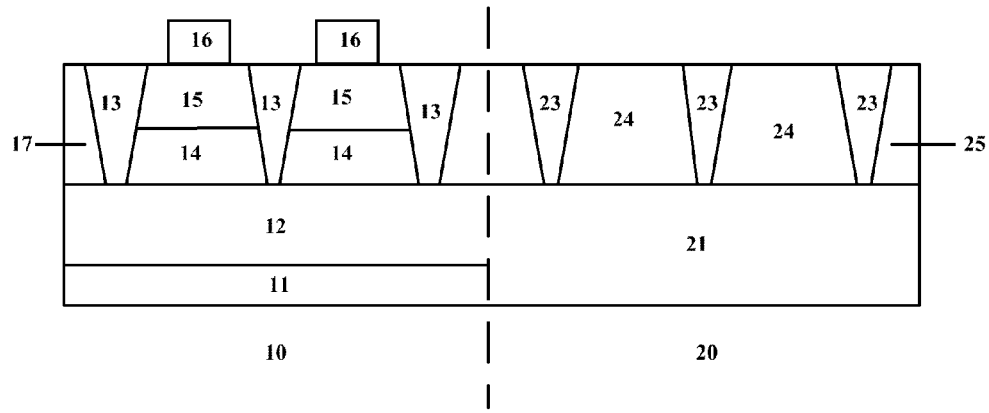

Numerous design details are described hereinafter for a better understanding of the invention. However, the invention can be implemented in other ways different from these described herein, and those skilled in the art can make modifications or alternations without departing from the scope of the invention. Therefore, the invention shall not be limited to the embodiments described below.

As mentioned above, in a conventional method for forming a phase change memory, peripheral circuits can not work normally, and the vertical LEDs with silicon-based PN junctions may produce carrier drain current formed by electrical field at the PN junction, which goes against improvement of density and power consumption of the phase change memory.

In order to overcome the deficiencies, the present invention provides a phase change memory, which comprises a storage region and a peripheral circuit region.

The peripheral circuit region comprises a peripheral substrate, peripheral shallow trench isolation (STI) units in the peripheral substrate, and MOS transistors on the peripheral substrate and between the peripheral STI units.

The storage region comprises a storage substrate, an N-type ion buried layer on the storage substrate, vertical LEDs on the N-type ion buried layer, storage shallow trench isolation (STI) units between the vertical LEDs, and phase change layers on the vertical LEDs and between the storage STI units. The storage STI units have thickness equal to thickness of the vertical LEDs. The peripheral STI units have thickness equal to thickness of the storage STI units.

Each vertical LED comprises an N-type conductive region on the N-type ion buried layer, and a P-type conductive region on the N-type conductive region. The N-type conductive region contains SiC. A top of P-type conductive region is flush with a top of the peripheral substrate.

The present invention further provides a method for fabricating the phase change memory.

The method comprises:

S1601: providing a substrate including a storage substrate and a peripheral substrate;

S1602: forming a sacrificial dielectric layer on the peripheral substrate;

S1603: etching the storage substrate and forming an N-type ion buried layer on the storage substrate;

S1604: forming a plurality of vertical LEDs on the N-type ion buried layer. Each vertical LED comprises an N-type conductive region on the N-type ion buried layer, and a P-type conductive region on the N-type conductive region. The N-type conductive region contains SiC. A top of P-type conductive region is flush with a top of the peripheral substrate.

S1605: removing the sacrificial dielectric layer on the peripheral substrate;

S1606: forming a plurality of storage STI units between the vertical LEDs, and forming a plurality of peripheral STI units in the peripheral substrate. The storage STI units have thickness equal to thickness of the vertical LEDs, and the peripheral STI units have thickness equal to thickness of the storage STI units.

S1607: forming a plurality of phase change layers on the vertical LEDs and between the storage STI units, and forming at least one MOS transistor on the peripheral substrate and between the peripheral STI units.

The N-type conductive region of the phase change memory contains SiC, decreasing drain current in the vertical LEDs, and raising current efficiency of the vertical LEDs. The peripheral circuit region can work normally without impacting performance of the phase change memory.

Figure 8:
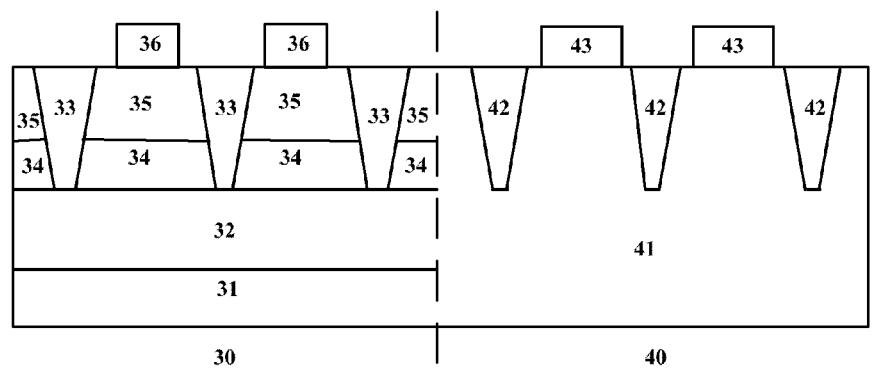
FIG. 8 schematically shows a phase change memory according to an embodiment of the present invention.

As shown in FIG. 8, according to one embodiment of the invention, the phase change memory comprises a storage region 30 and a peripheral circuit region 40.

The storage region 30 comprises a storage substrate 31, an N-type ion buried layer 32 on the storage substrate 31, a plurality of vertical LEDs on the N-type ion buried layer 32, a plurality of storage shallow trench isolation (STI) units 33 in the vertical LEDs, and a plurality of phase change layers 36 on the vertical LEDs and between the storage STI units 33.

Each vertical LED comprises an N-type conductive region 34 on the N-type ion buried layer 32, and a P-type conductive region 35 on the N-type conductive region 34.

The storage STI units have thickness substantially equal to thickness of the vertical LEDs. The peripheral STI units have thickness substantially equal to thickness of the storage STI units.

The peripheral circuit region 40 comprises a peripheral substrate 41, peripheral shallow trench isolation (STI) units 42 in the peripheral substrate 41, and MOS transistors 43 on the peripheral substrate 41 and between the peripheral STI units 42. A top of P-type conductive region 35 is flush with a top of the peripheral substrate 41. The peripheral STI units 42 have thickness equal to thickness of the storage STI units 33.

In one embodiment, the storage substrate 31 and the peripheral substrate 41 are both silicon-based. The N-type ion buried layer 32 contains arsenic ions. The N-type ions are selected from arsenic ions and phosphorus ions. The P-type ions may be boron ions. The implant energy and dopant concentration of the N-type ions and the P-type ions are well known to the skilled in the art.

The number of the MOS transistors 43 of the peripheral circuit region 40 is not limited, for example one or above, and may vary depending on requirements of functions of the peripheral circuit region 40.

In one embodiment, the SiC of N-type conductive region 34 contains carbon with molar ratio ranging from 1% to 3%.

In one embodiment, a heating layer (not shown) is formed between the P-type conductive region 35 and the phase change layer 36.

FIGS. 9-15 illustrate a method for fabricating the phase change memory of FIG. 8, according to an embodiment of the present invention.

Figure 16:
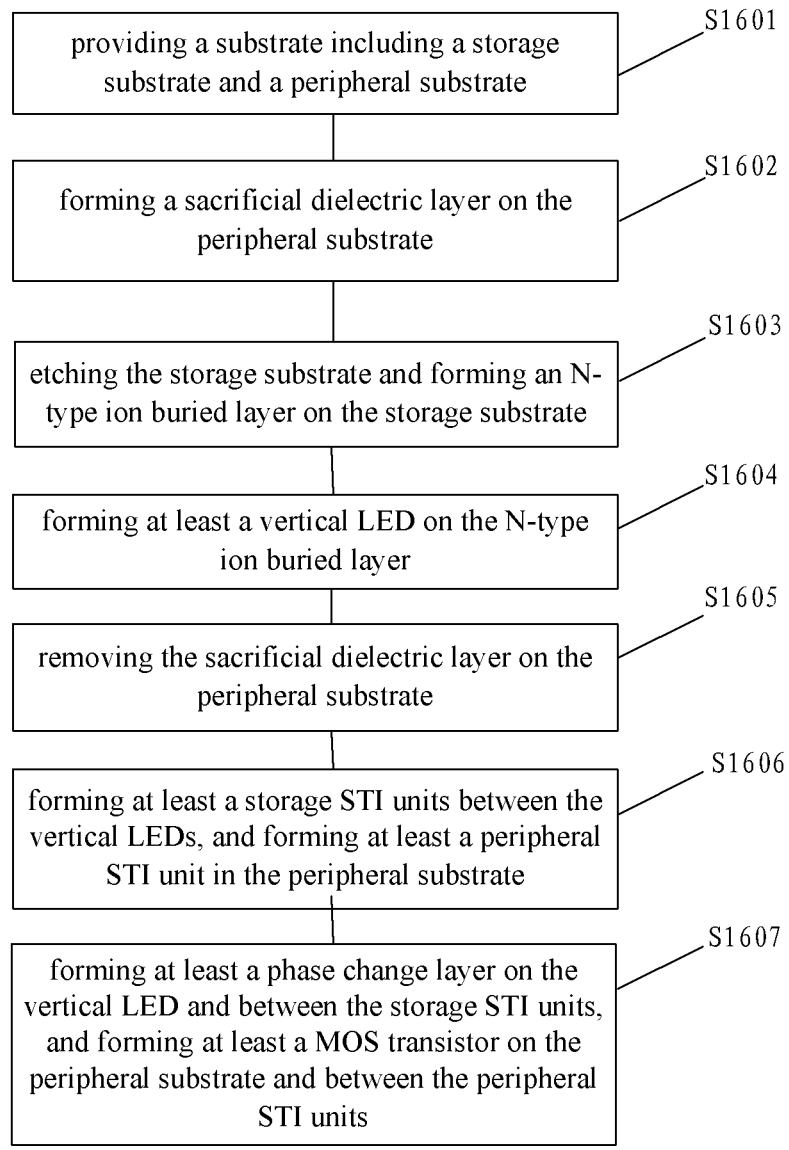
FIG. 16 is a flow chart of the method for forming the phase change memory according to an embodiment of the present invention.

Referring to FIG. 16, the method comprises:

S1601: providing a substrate including a storage substrate 31 and a peripheral substrate 41;

S1602: forming a sacrificial dielectric layer 44 on the peripheral substrate 41;

S1603: etching the storage substrate 31 and forming an N-type ion buried layer 32 on the storage substrate 31;

S1604: forming a plurality of vertical LEDs on the N-type ion buried layer 32. Each vertical LED comprises an N-type conductive region 34 on the N-type ion buried layer 32, and a P-type conductive region 35 on the N-type conductive region 34. The N-type conductive region 34 contains SiC. A top of P-type conductive region 35 is flush with a top of the peripheral substrate 41.

S1605: removing the sacrificial dielectric layer 44 on the peripheral substrate 41;

S1606: forming storage STI units 33 between the vertical LEDs, and forming peripheral STI units 42 in the peripheral substrate 41. The storage STI units 33 have thickness equal to thickness of the vertical LEDs, and the peripheral STI units 42 have thickness equal to thickness of the storage STI units 33.

S1607: forming phase change layers 36 on the vertical LEDs and between the storage STI units 33, and forming MOS transistors 43 on the peripheral substrate 41 and between the peripheral STI units 42.

Finally, a storage region 30 and a peripheral circuit region 40 are formed.

Figure 9:
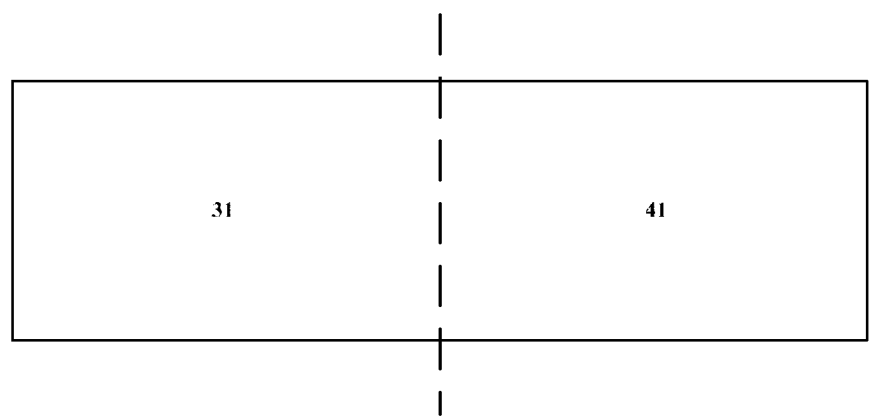
FIGS. 9-15 are cross-sectional views of intermediate structures of the phase change memory, illustrating a method for forming the phase change memory according to an embodiment of the present invention.

The method for fabricating the phase change memory is described below in detail accompanying with FIGS. 9-15. Referring to FIG. 9, in the step S1601, a substrate is provided, which includes a storage substrate 31 and a peripheral substrate 41. In one embodiment, the substrate is silicon-based, and comprises a storage substrate 31 and a peripheral substrate 41. Size of the storage substrate 31 and the peripheral substrate 41 depends on practical requirements.

Figure 10:
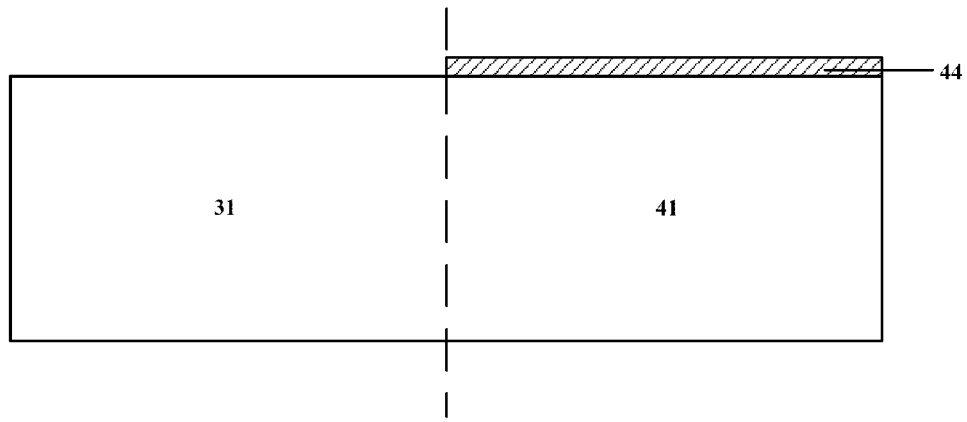
Figure 11:
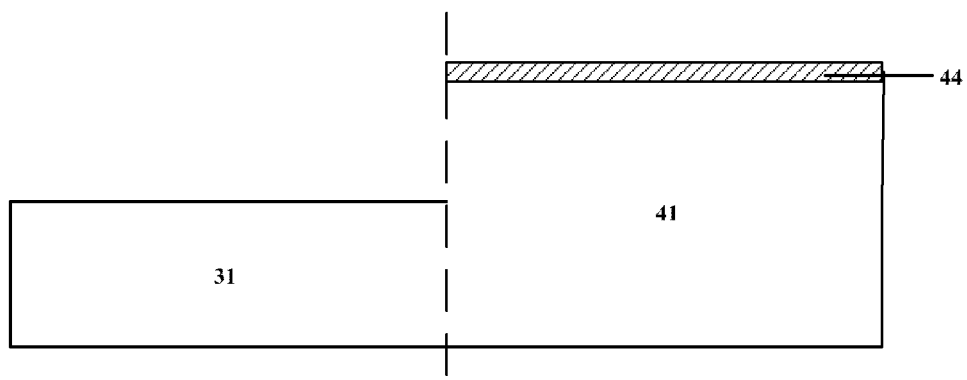

Referring to FIG. 10, in the step S1602, a sacrificial dielectric layer 44 is formed on the peripheral substrate 41. In one embodiment, the sacrificial dielectric layer 44 is formed in such a way that oxide or nitride (for example silicon nitride) is deposited on the peripheral substrate 41 by low pressure chemical vapor deposition. Alternative, oxide or nitride (for example silicon nitride) is deposited on the peripheral substrate 41 by plasma enhanced chemical vapor deposition. The sacrificial dielectric layer 44 has thickness ranging from 5 nm to 50 nm. In subsequent steps, selective epitaxial growth can be performed at a region exempt from the sacrificial dielectric layer 44.

Figure 12:
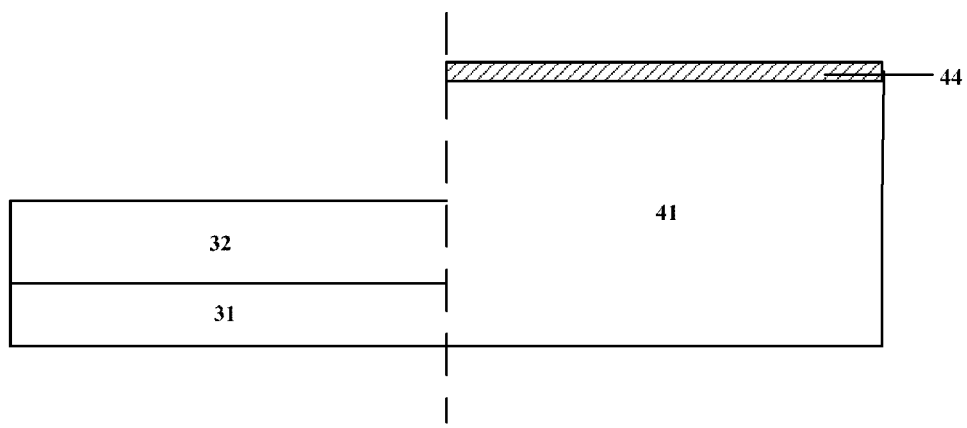

In the step S1603, the storage substrate 31 is etched and an N-type ion buried layer 32 is formed. As shown in FIG. 12, an N-type ion buried layer 32 is formed in the storage substrate 31. It should be appreciated that N-types ions are implanted into the storage substrate 31 before etching the storage substrate 31 or after etching the storage substrate 31.

In one embodiment, the storage substrate 31 is etched by wet etching or dry etching. The storage substrate 31 is far lower than the peripheral substrate 41. Etching thickness is equal to thickness of the vertical LEDs. Arsenic ions are implanted into the etched storage substrate 31 for forming the N-type ion buried layer 32 in the storage substrate 31.

In another embodiment, the N-type ion buried layer is formed in the storage substrate, and then the storage substrate is etched. In a specific embodiment, arsenic ions are implanted into the storage substrate for forming the N-type ion buried layer. Notably, the implant energy of the arsenic ions is far larger than that of the aforementioned embodiment. Implant depth of the arsenic ions is larger than thickness of the vertical LEDs and is smaller than a sum of thickness of the vertical LEDs and thickness of the N-type ion buried layer. Then the storage substrate is etched by wet etching or dry etching for exposing the N-type ion buried layer. Etching thickness is equal to the thickness of the vertical LEDs.

Figure 13:
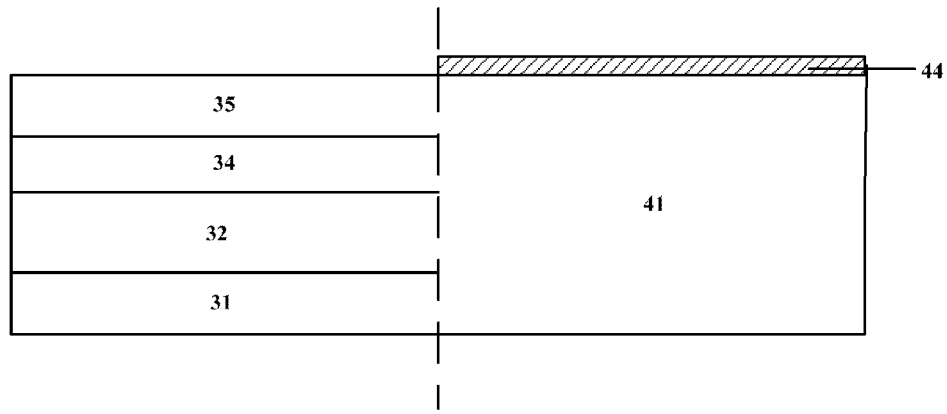

Referring to FIG. 13, in the step S1604, the vertical LEDs are formed in the N-type ion buried layer 32. A fabrication method of the vertical LEDs comprises: forming the N-type conductive region 34 and the P-type conductive region 35. The N-type conductive region 34 is formed on the N-type ion buried layer 32, and the P-type conductive region 35 is formed on the N-type conductive region 34. The N-type conductive region 34 contains N-type ions and SiC. A top of P-type conductive region 35 is flush with a top of the peripheral substrate 41.

Four exemplary specific embodiments are described below for further explaining the fabrication method of the vertical LED.

According to a first exemplary specific embodiment, in the step S1604, an N-type conductive region 34 is formed on the N-type ion buried layer 32 by selective epitaxial growth. Reaction gases for selective epitaxial growth comprise SiC and N-type ions. Then a P-type conductive region 35 is formed on the N-type conductive region 34 by selective epitaxial growth. Reaction gases for selective epitaxial growth comprise Si atoms and P-type ions.

In one embodiment, reduced pressure chemical vapor deposition (RPCVD) selective epitaxial growth is used for forming the N-type conductive region 34 on the N-type ion buried layer 32. The selective epitaxial growth reaction gases comprise SiC and N-type ions. The sacrificial dielectric layer 44 is formed on the peripheral substrate 41. As a result, there are no SiC atoms and the N-type ions on the peripheral substrate 41. In an alternative embodiment, other selective epitaxial growth method may be used.

The selective epitaxial growth reaction gases comprise SiC and N-type ions. The N-type ions are selected from arsenic ions and phosphorus ions, the growth source gases containing silicon are selected from $SiH_4$, $Si_2H_6$ and $SiH_2Cl_2$. The flow of the growth source gases containing silicon is ranged from 50 to 1000 sccm. The growth source gases containing carbon comprise $C_3H_8$, and flow of the growth source gases is ranged from 5 to 500 sccm. The selective gases comprise HCl, and the flow of the selective gases is ranged from 10 to 200 sccm. The carrying gases are $H_2$, and the flow of the carrying gases is ranged from 5 to 100 slm. The temperature of selective epitaxial growth is ranged from 500 to 1000 degree census. Pressure is ranged from 3 to 50 Torr.

In the case that the N-type ions comprise arsenic ions, the growth source gases containing arsenic ions are AsH4, and flow of the growth source gases containing arsenic is ranged from 0.5 to 300 sccm. In the case that the N-type ions comprise phosphorus ions, the growth source gases containing phosphorus ions are PH3. The flow of the growth source gases containing phosphorus ions is ranged from 0.5 to 300 sccm. In the N-type conductive region 34, the reaction gas SiC has C concentration with a molar ratio ranging from 1% to 3%.

The P-type conductive region 35 is formed on the N-type conductive region 34 by selective epitaxial growth. The reaction gases of selective epitaxial growth comprise Si atoms and P-type ions. In one embodiment, the P-type ions are boron ions, and the growth source gases containing boron comprise $B_2H_6$. The flow of the growth source gases containing boron is ranged from 0.5 to 300 sccm.

The N-type conductive region 34 and the P-type conductive region 35 are formed. In the vertical LED on the N-type ion buried layer 32, a top of the P-type conductive region 35 is flush with a top of the peripheral substrate 41.

In a second exemplary specific embodiment for showing formation of vertical LEDs on the N-type ion buried layer 32, a fabrication method of the vertical LEDs comprises: (1) an N-type conductive region 34 is formed on the N-type ion buried layer 32 by selective epitaxial growth, and reaction gases for selective epitaxial growth comprise SiC and N-type ions; and (2) a monocrystalline layer grows on the N-type conductive region 34 by selective epitaxial growth. P-type ions are implanted into the monocrystalline layer for forming the P-type conductive region 35.

In this embodiment, the monocrystalline layer grows on the N-type conductive region 34 by selective epitaxial growth. A top of the monocrystalline layer is flush with a top of the peripheral substrate 41. Then P-type ions are implanted into the monocrystalline layer.

In a third exemplary specific embodiment for showing formation of vertical LEDs on the N-type ion buried layer 32, a fabrication method of the vertical LEDs comprises: (1) a SiC layer is formed on the N-type ion buried layer 32 by selective epitaxial growth, and ions are implanted to the SiC layer for forming the N-type conductive region 34; and (2) the P-type conductive region 35 is formed on the N-type conductive region 34 by selective epitaxial growth. Reaction gases for selective epitaxial growth comprise Si atoms and P-type ions.

In this embodiment, a SiC layer is formed on the N-type ion buried layer 32 by selective epitaxial growth. Then N-type ions are implanted into the SiC layer for forming the N-type conductive region 34. In the N-type conductive region 34, the reaction gas SiC has C concentration with a molar ratio ranging from 1% to 3%.

In a fourth exemplary specific embodiment for showing formation of vertical LEDs on the N-type ion buried layer 32, a fabrication method of the vertical LEDs comprises: (1) a SiC layer is formed on the N-type ion buried layer 32 by selective epitaxial growth, and ions are implanted to the SiC layer for forming the N-type conductive region 34; and (2) a monocrystalline layer grows on the N-type conductive region 34 by selective epitaxial growth. P-type ions are implanted into the monocrystalline layer for forming the P-type conductive region 35.

Figure 14:
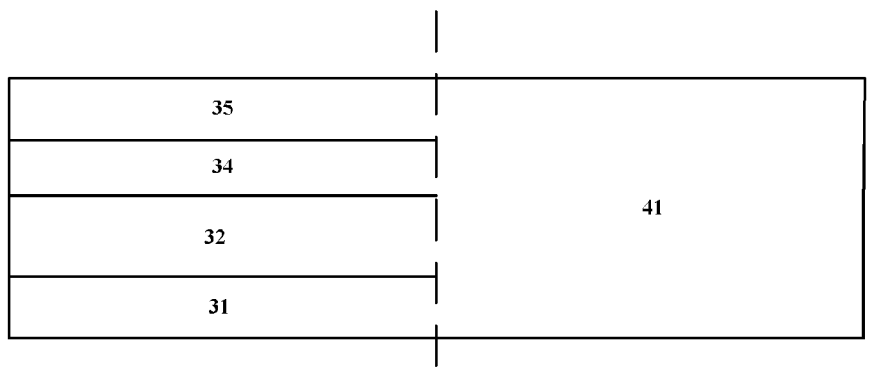

Referring to FIG. 14, in the step S1605, the sacrificial dielectric layer 44 on the peripheral substrate 41 is removed. In one embodiment, the sacrificial dielectric layer 44 on the peripheral substrate 41 is removed by wet etching. In an alternative embodiment, the sacrificial dielectric layer 44 on the peripheral substrate 41 may be removed by other processes in prior art.

Figure 15:
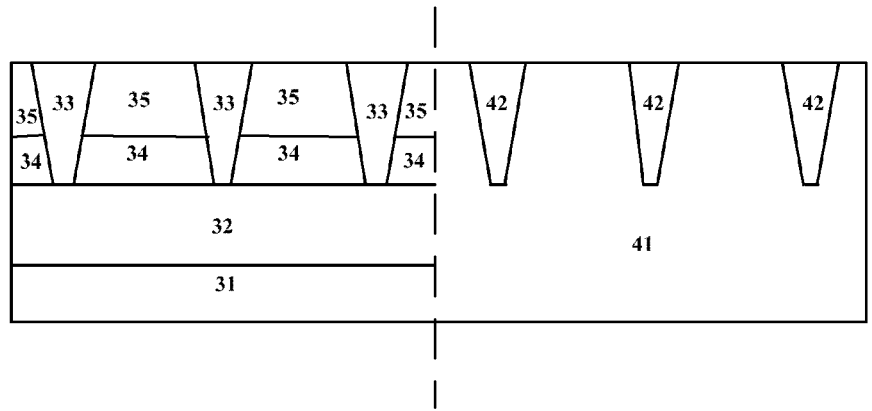

Referring to FIG. 15, in the step S1606, the storage STI units 33 are formed between the vertical LEDs, and at the same time the peripheral STI units 42 are formed in the peripheral substrate 41. The storage STI units 33 have thickness identical to thickness of the vertical LEDs, and the peripheral STI units 42 have thickness identical to thickness of the storage STI units 33.

In the embodiment, the storage STI units 33 are formed and the peripheral STI units 42 are formed at the same time. The storage STI units 33 are formed and the peripheral STI units 42 have the same thickness. The thickness of the storage STI units 33 and the peripheral STI units 42 are equal to the thickness of the vertical LEDs. The number of the storage STI units 33 and the number of the peripheral STI units 42 respectively depend on practical requirements.

In the step S1607, the phase change layers 36 on the vertical LED are formed between the storage STI units 33. MOS transistors 43 are formed on the peripheral substrate 41 and between the peripheral STI units 42. The number of the MOS transistors may vary depending on requirements, and may be, for example one or more.

Finally, the storage region 30 and the peripheral circuit region 40 are completed for forming the phase change memory. In one embodiment, a heating layer is provided on the vertical LEDs between P-type conductive region 35 and the phase change layer 36 before formation of the phase change layer 36.

By the present invention, the N-type conductive region containing SiC reduces drain current through the vertical LEDs, thereby raising current efficiency of the vertical LEDs. On the other hand, the storage substrate is etched, and height difference is apparently formed between the storage substrate and the peripheral substrate. The sacrificial dielectric layer is formed on the peripheral substrate for forming the N-type ion buried layer and the vertical LEDs on the storage substrate in sequence. A top of the vertical LEDs is flush with a top of the peripheral substrate. Then the sacrificial dielectric layer on the peripheral substrate is removed. In this way, a monocrystalinn layer on the peripheral substrate is not needed. The fabrication cost is reduced correspondingly. The peripheral circuit region can work perfectly without adverse influence on performance of the phase change memory.

The invention is disclosed, but not limited, by preferred embodiment as above. Based on the disclosure of the invention, those skilled in the art shall make any variation and modification without deviation from the scope of the invention. Therefore, any simple modification, variation and polishing based on the embodiments described herein belongs to the scope of the invention.

What is claimed is:

1. A method for fabricating a phase change memory, comprising:
   providing a substrate including a storage substrate and a peripheral substrate;
   forming a sacrificial dielectric layer on the peripheral substrate;
   etching the storage substrate and forming an N-type ion buried layer on the storage substrate;
   forming a plurality of vertical LEDs on the N-type ion buried layer, each vertical LED comprising an N-type conductive region containing SiC on the N-type ion buried layer, and a P-type conductive region on the N-type conductive region, a top of P-type conductive region being flush with a top of the peripheral substrate;
   removing the sacrificial dielectric layer on the peripheral substrate;
   forming a plurality of storage STI units between the vertical LEDs, and forming a plurality of peripheral STI units in the peripheral substrate, the storage STI units having thickness substantially equal to thickness of the vertical LEDs, and the peripheral STI units having thickness substantially equal to thickness of the storage STI units; and
   forming a plurality of phase change layers on the vertical LEDs and between the storage STI units, and forming at least one MOS transistor on the peripheral substrate and between the peripheral STI units.

2. The method according to claim 1, wherein the N-type ion buried layer is formed by implanting N-types ions into the storage substrate before etching the storage substrate.

3. The method according to claim 1, wherein the N-type ion buried layer is formed by implanting N-types ions into the storage substrate after etching the storage substrate.

4. The method according to claim 1, wherein the N-type conductive region is formed on the N-type ion buried layer by selective epitaxial growth, and reaction gases for selective epitaxial growth comprise SiC and N-type ions.

5. The method according to claim 4, wherein the reaction gas SiC has C concentration with a molar ratio ranging from 1% to 3%.

6. The method according to claim 4, wherein a SiC layer is formed on the N-type ion buried layer by selective epitaxial growth, and N-type ions are implanted into the SiC layer for forming the N-type conductive region.

7. The method according to claim 6, wherein the reaction gas SiC has C concentration with a molar ratio ranging from 1% to 3%.

8. The method according to claim 1, wherein the P-type conductive region is formed on the N-type conductive region by selective epitaxial growth, and wherein reaction gases comprise SiGe and P-type ions.

9. The method according to claim 8, wherein a SiGe layer is formed on the N-type conductive region by selective epitaxial growth, and P-type ions are implanted into the SiGe layer for forming the P-type conductive region.

10. The method according to claim 1, wherein the sacrificial dielectric layer has thickness ranging from 5 nm to 50 nm.

11. The method according to claim 1, wherein oxide or nitride is deposited on the peripheral substrate by low pressure chemical vapor deposition for forming the sacrificial dielectric layer.

12. The method according to claim 1, wherein oxide or nitride is deposited on the peripheral substrate by plasma enhanced chemical vapor deposition for forming the sacrificial dielectric layer.

* * * * *